United States Patent [19]
Migita et al.

[11] Patent Number: 5,299,217
[45] Date of Patent: Mar. 29, 1994

[54] SEMICONDUCTOR LIGHT-EMITTING DEVICE WITH CADMIUM ZINC SELENIDE LAYER

[75] Inventors: Masahito Migita, Hachioji; Akira Taike, Kokubunji; Tsukuru Ohtoshi, Hanno, all of Japan

[73] Assignee: Hitachi, Ltd., Tokyo, Japan

[21] Appl. No.: 774,878

[22] Filed: Oct. 11, 1991

[30] Foreign Application Priority Data

Oct. 11, 1990 [JP] Japan ................................ 2-270393

[51] Int. Cl.⁵ ............................................. H01S 3/19
[52] U.S. Cl. .................................. 372/45; 257/79; 257/103; 257/613
[58] Field of Search .................. 372/45, 43, 44, 46; 357/16, 17; 257/13, 14, 15, 22, 79, 94, 102, 103, 613

[56] References Cited

U.S. PATENT DOCUMENTS

| | | | |
|---|---|---|---|
| 3,374,176 | 3/1968 | Potter | 257/79 |
| 3,496,429 | 2/1970 | Robinson | 257/609 |
| 3,599,059 | 8/1971 | Hou | 257/614 |
| 5,081,632 | 1/1992 | Migita et al. | 372/45 |

FOREIGN PATENT DOCUMENTS 60-178684  9/1985  Japan.
63-95692   4/1988  Japan.

OTHER PUBLICATIONS

Preprint of Lectures in 37th Associated Meeting of Applied Physics, vol. 1, p. 200, No. 28-p-S-3, 1990. (no month).

Primary Examiner—James W. Davie
Attorney, Agent, or Firm—Antonelli, Terry Stout & Kraus

[57] ABSTRACT

A semiconductor light-emitting device containing as first and second semiconductor layers a semiconductor of $Cd_xZn_{1-x}S_ySe_{1-y}$ ($0<x\leq 1$, $0\leq y\leq 1$) and as an active layer a semiconductor of $Cd_xZn_{1-x}S_ySe_{1-y}$ ($0\leq x\leq 1$, $0\leq y\leq 1$) formed between the first and second semiconductor layers, if necessary sandwiching the active layer with a pair of light guiding layers, can emit a blue laser light excellent in properties and high in reliability.

29 Claims, 3 Drawing Sheets

SEMICONDUCTOR LIGHT-EMITTING DEVICE WITH CADMIUM ZINC SELENIDE LAYER

BACKGROUND OF THE INVENTION

This invention relates to a semiconductor light-emitting device, more particularly to a blue light emitting semiconductor laser.

Conventional semiconductor lasers have a double-hetero structure made of III-V compound semiconductor materials such as $In_xGa_{1-x}P_yAs_{1-y}$/GaAs, $Ga_xAl_{1-x}As$/GaAs, $In_xAl_{1-x}P/In_yGa_{1-y}P$ ($0 < x$ and $y < 1$), etc. Thus, their emitting wavelength is limited to an infrared region and visible red region.

On the other hand, semiconductor lasers having an emitting wavelength in visible short-wavelength regions will have many advantages, if practically utilized. For example, if a blue light semiconductor laser is utilized for an optical disk, the recording density can be increased. A semiconductor laser of ultraviolet region over to the green region can make the sensitivity of an optical printer higher. Further, plastic optical fibers, which are regarded as important in short-distance communications, have a high loss in the infrared region and have a low-loss region at about 550 nm. Thus, green light semiconductor laser has been regarded as an important light source for short-distance communications. Furthermore, ultraviolet light semiconductor laser could be applied as a light source for phosphor excitation or as a light source for process technique using light-sensitive materials or as an experimental light source. Thus, visible light semiconductor lasers having a shorter wavelength than 0.5 $\mu$m band have many advantages and their practical application have been keenly desired.

As the semiconductor lasers emitting light in the blue region, Japanese Patent Unexamined Publication (JP-A) No. 60-178684 discloses a semiconductor laser having a double-hetero structure, wherein a four-component mixed crystal system of $ZnS_xSe_yTe_{1-x-y}$ ($0 \leq x$, $y \leq 1$) is used as an active layer.

Japanese Patent Unexamined Publication (JP-A) No. 63-95692 discloses a semiconductor laser having a layer of $ZnS_xTe_{1-x}$ ($0 \leq x \leq 1$) sandwiched by p-type and n-type layers of $ZnS_yTe_{1-y}$ ($0 \leq y \leq 1$).

A semiconductor laser having a double-hetero structure comprising a $ZnS_xTe_{1-x}$ layer, both sides of which are formed p-type and n-type layers of $ZnS_yTe_{1-y}$, and having an emitting wavelength in the 0.5 $\mu$m band region is disclosed in U.S. patent application Ser. No. 07/469,382, now U.S. Pat. No. 5,801,632.

Further, production of iodine doped n-type ZnCdS thin film and electrical properties thereof are disclosed in Preprint of Lectures in 37th Associated Meeting of Applied Physics vol. 1, p. 200 (Lecture No. 28-p-S-3), 1990.

SUMMARY OF THE INVENTION

The semiconductor laser of JP-A No. 60-178684 has a problem in that the most suitable double-hetero structure is not established, since no consideration is given to the non-linear effect (a bowing phenomenon) on the mixed crystal system as to the band gap energy ($E_G$) of the mixed crystal system.

JP-A No. 63-95692 gives no consideration on a number of interface states formed near the interface of the active layer and the cladding layers, resulting in causing a problem in that said interface states act as non-luminescence centers.

According to U.S. patent application Ser. No. 07/469,382, now U.S. Pat. No. 5,801,632, in order to obtain a blue light semiconductor laser oscillating in the 0.4 $\mu$m band region, it is necessary to introduce a superlattice structure comprising $ZnS_xSe_{1-x}/ZnS_yTe_{1-y}$ into the active layer. This is very difficult from the viewpoint of production process.

Further, according to the Preprint of Lectures in 37th Associated Meeting of Applied Physics (Lecture No. 28-p-S-3), the n-type ZnCdS has a carrier density of less than $10^{17}$ cm$^{-3}$ at the best, and thus cannot be used practically in semiconductor devices.

Thus, it is an object of the present invention to provide a blue light emitting element, particularly a blue light emitting diode (blue LED) and a blue light semiconductor laser excellent in blue light properties, and high in relaibility with a simple structure.

The present invention provides a semiconductor light-emitting device comprising a layer of a semiconductor having a crystal composition of (Cd,Zn)S and p-type conductivity.

The present invention also provides a semiconductor light-emitting device comprising a layer of a semiconductor having a crystal composition of (Cd, Zn)S, a carrier concentration of $10^{17}$ cm$^{-3}$ or more and n-type conductivity.

The present invention further provides a semiconductor light-emitting device comprising a substrate, and formed thereon a first semiconductor having a first conductivity, a second semiconductor having a second conductivity (opposed to the first conductivity), and a third semiconductor sandwiched by said first and second semiconductors, said first and second semiconductors being thin films containing a composition of (Cd, Zn)S, and said third semiconductor being a thin film containing a composition of Zn(S, Se).

The present invention still further provides a semiconductor light-emitting device mentioned above wherein the band gap energy of each of the first and second semiconductors is larger than that of the third semiconductor.

The present invention also provides a semiconductor light-emitting device mentioned above, wherein the crystalline substrate, and the first, second and third semiconductors are almost lattice matched.

The present invention still provides a semiconductor light-emitting device comprising a substrate of GaAs or ZnSe, and formed thereon a first semiconductor having p- or n-type conductivity and a composition of (Cd, Zn)S, a second semiconductor having n- or p-type conductivity and a composition of (Cd, Zn)S, and a third semiconductor having a composition of Zn(S, Se) and sandwiched by said first and second semiconductors, said crystalline substrate, and said first, second and third semiconductors being almost lattice matched.

The present invention further provides a semiconductor light-emitting device comprising a substrate, a layer of a first semiconductor having a first conductivity formed on the substrate, a layer of a third semiconductor formed on the first semiconductor layer, and a layer of a second semiconductor having a second conductivity (opposed to the first conductivity) formed on the third semiconductor layer, said first and second semiconductors having a composition of $$Cd_xZn_{1-x}S_ySe_{1-y} (0 < x \leq 1, 0 \leq y \leq 1)$$

and the third semiconductor having a composition of $Cd_xZn_{1-x}S_ySe_{1-y}$ ($0<x\leq 1$, $0\leq y\leq 1$), a band gap energy smaller than those of the first and second semiconductors, and a refractive index larger than those of the first and second semiconductors.

The present invention still further provide a semiconductor light-emitting device having a structure as mentioned above, and at least one surface of the third semiconductor is covered with a light guiding layer.

DESCRIPTION OF THE PREFERRED EMBODIMENTS

Figure 1:
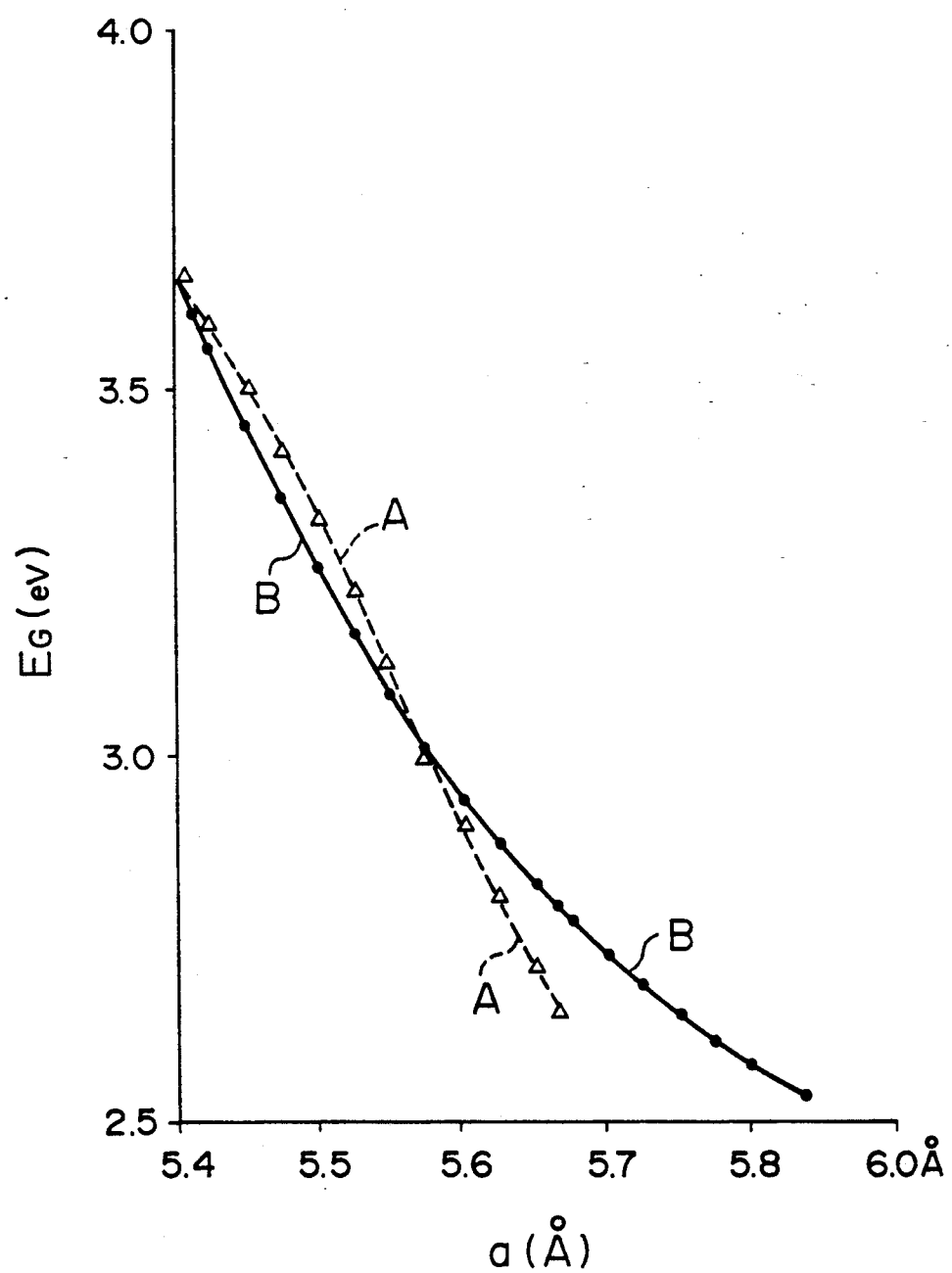
FIG. 1 is a graph showing a relationship between the lattice constants and band gap energy in $ZnS_xTe_{1-x}$ ($0\leq x\leq 1$) mixed crystals and $Cd_yZn_{1-y}S$ ($0\leq y\leq 1$) mixed crystals.

As the substrate, there can preferably be used a semiconductor having a composition of $$Cd_xZn_{1-x}S_ySe_{1-y}$$

wherein $0\leq x\leq 1$ and $0\leq y\leq 1$, $$Ga_xAl_yIn_{1-x-y}As_zP_{1-z}$$

wherein $0\leq x+y\leq 1$ and $0\leq z\leq 1$, or $$Si_xGe_{1-x}$$

wherein $0\leq x\leq 1$.

More concretely, the substrate is formed by zinc selenide (ZnSe), zinc sulfoselenide (ZnSSe), cadmium zinc selenide (CdZnSe), cadmium zinc sulfoselenide (CdZnSSe), gallium arsenic (GaAs), GaAlAs, GaAlInAs, GaAlAsP, GaAlInAsP, Si, Ge or SiGe.

The layer of a first semiconductor and the layer of a second semiconductor can be formed by using a semiconductor having a composition of $$Cd_xZn_{1-x}S_ySe_{1-y}$$

wherein $0<x\leq 1$ and $0\leq y\leq 1$, for example, cadmium zinc selenide (CdZnSe), cadmium zinc sulfoselenide (CdZnSSe), etc. doped with a p-type dopant such as N, As, P, Sb, Li, Na, Au, Cu, etc., or an n-type dopant such as Cl, I, Br, Ga, Al, In, etc.

As the p-type dopant, there can be used $N_2$, $NH_3$, $H_2As$, $PH_3$, Li, Na, Au, Cu, etc., organic nitrogen such as triethylamine [$N(C_2H_5)_3$], etc. organic. As such as $As(C_2H_5)_3$, etc., organic phosphur such as $P(C_2H_5)_3$, etc., zinc nitride ($Zn_3N_2$), zinc arsenide (ZnAs), zinc phosphide ($Zn_3P_2$), etc.

As the n-type dopant, there can be used zinc chloride ($ZnCl_2$), Zinc iodide ($ZnI_2$), zinc bromide ($ZnBr_2$), Ga, Al, In, organic aluminum such as aluminum trimethyl [$(CH_3)_3Al$], etc.

The first and second semiconductor layers, or first and second cladding layers, can be formed by molecular beam epitaxy (MBE) (e.g. growth temperature: 150° to 300° C., pressure during growth: $10^{-5}$ to $10^{-7}$ Torr), metalorganic molecular beam epitaxy (MOMBE) (e.g. growth temperature: 200° to 400° C., pressure during growth: $10^{-4}$ to $10^{-6}$ Torr), metalorganic vapor phase epitaxy (MOVPE) (e.g. growth temperature: 300° to 550° C., pressure during growth: $10^{-2}$ to 760 Torr), etc., with a thickness of preferably 2 μm or more (the first layer), or a thickness of preferably 0.1 μm or more (the second layer).

The first or second semiconductor layer preferably has a carrier concentration of $10^{17}$ cm$^{-3}$ or more at room temperature, more preferably $5\times 10^{17}$ cm$^{-3}$ or more at room temperature.

The first conductivity and the second conductivity of the first semiconductor layer and the second semiconductor layer means an n-type conductivity and a p-type conductivity and vice versa.

The layer of a third semiconductor or an active layer formed on the first semiconductor layer has a composition of $$Cd_xZn_{1-x}S_ySe_{1-y}$$

wherein $0\leq x\leq 1$, and $0\leq y\leq 1$, for example, zinc selenide (ZnSe), cadmium zinc selenide (CdZnSe), zinc sulfoselenide (ZnSSe) and cadmium zinc sulfoselenide (CdZnSSe).

The third semiconductor layer can be formed by MBE, MOMBE, MOVPE, etc. with a thickness of preferably 2 nm to 0.1 μm. Further, the third semiconductor layer can be alternately laminated layers (e.g. 1-10 periods) having a pseudmorphic lattice matched state.

The third semiconductor layer preferably has the band gap energy smaller than those of the first and second semiconductor layers, by 0.1 eV or more.

Further, the third semiconductor layer has a refractive index at the light-emitting wavelength larger than those of the first and second semiconductor layers, by, e.g., 0.2 (λ) or more.

It is preferable that all the semiconductors including the first, second and third semiconductors are almost lattice matched.

The semiconductor light-emitting device further comprises a first electrode coupled to the semiconductor substrate and a second electrode coupled to the second semiconductor (or cladding) layer, and is provided preferably a hetero junction between the active layer (the third semiconductor layer) and the first semiconductor (or cladding) layer and between the active layer and the second semiconductor (or cladding) layer.

In order to improve the effects of the present invention, it is preferable to cover at least one surface of the active layer with a light guiding layer. The light guiding layer can be formed by using a material having a larger refractive index than the first and second cladding layers and a composition selected from the group consisting of $$Zn_xCd_{1-x}S_ySe_zTe_{1-y-z}$$

wherein $0 \leq x, y, z \leq 1$, and $0 \leq y+z \leq 1$, $$Ga_y Al_z In_{1-y-z} As_x P_{1-x}$$

wherein $0 \leq x, y, z \leq 1$, and $0 \leq y+z \leq 1$, and $$Si_x Ge_{1-x}$$

wherein $0 \leq x \leq 1$.

The light guiding layer can be formed by MBE, MOMBE, MOVPE, etc.

FIG. 1 is a graph showing a relationship between the lattice constants (a) and band gap energy ($E_G$) in $ZnS_x Te_{1-x}$ ($0 \leq x \leq 1$) mixed crystals and $Cd_y Zn_{1-y}S$ ($0 \leq y \leq 1$) mixed crystals. In FIG. 1, the cruve A shows the relationship between the lattice constants and the band gap energy ($E_G$) of $ZnSe_x S_{1-x}$ ($0 \leq x \leq 1$) prepared by changing the proportions of S and Se. As the substrate, ruby was used. A film of $ZnSe_x S_{1-x}$ of 1000 Å thick was grown by MBE. $E_G$ was measured by a two-beam absorption spectroscopy. The lattice constant at (100) plane of SB (zinc blend) structure was measured by an electron beam diffraction method and a back scattering X-ray diffraction method.

The curve B in FIG. 1 shows the results of $Cd_y Zn_{1-y}S$ ($0 \leq y \leq 1$).

These results show that there is no significant difference in the film thickness of 50 to 3000 Å so long as $ZnSe_x S_{1-x}$ and $Cd_y Zn_{1-y}S$ are used.

In order to construct a double-hetero structure semiconductor laser, it is necessary to make $E_{GC} > E_{GA}$ wherein $E_{GC}$ means a band gap energy of a cladding layer and $E_{GA}$ means a band gap energy of the active layer.

According to the present invention, when the lattices are matched within 0.2%, the laser oscillation takes place at room temperature with the energy difference of $$E_{GC} - E_{GA} \geq 0.1 eV$$

Therefore, in order to bring about the laser oscillation at room temperature, it is preferable to grow the first, second and third semiconductor layers to have lattice constants in the range of 5.409 Å (ZnS) to 6.05 Å (CdSe). For example, in the case of using GdAs (100) (5.653 Å) substrate, preferable lattice constants are in the range of 5.6 Å to 5.7 Å. Needless to say, the lattice constants depend on the substrate material used and laser oscillation wavelength.

The present invention is illustrated by way of the following Examples.

EXAMPLE 1

On the (100) plane of ZnSe used as a substrate, N-doped $Cd_{0.61}Zn_{0.39}S$ was grown by metal-organic molecular beam epitaxy. The growth was carried out using zinc dimethyl (DMZ) and cadmium dimethyl as Group II raw materials, hydrogen sulfide ($H_2S$) as a Group VI raw material, and ammonia ($NH_3$) as a nitrogen-containing raw material, at a substrate temperature (Ts) of 350° C. under a pressure of $2 \times 10^{-4}$ Torr to the film thickness of 3 μm.

The Hall measurement of the resulting film showed the p-type conductivity at room temperature, the resistivity of 0.02 Ω·cm and the carrier concentration of $3.5 \times cm^{-3}$.

When N-doped $Cd_{0.57}Zn_{0.43}S$ was grown on the (100) plane of GaAs used as a substrate in the same manner as mentioned above, the resulting film had the resistivity of less than 1 Ω·cm.

EXAMPLE 2

On a GaAs (100 substrate heated at 350° C., Al-doped $Zn_{0.43}Cd_{0.57}S$ was grown in the same manner as described in Example 1 using aluminum trimethyl [$(CH_3)_3Al$] as an n-type dopant in thickness of 3 μm. When electrical properties were measured at room temperature, n-type conductivity was shown with the carrier concentration of $6.5 \times cm^{-3}$. When the growth conditions were changed, there was obtained the carrier concentration in the range of $2.1 \times 10^{17}$ to $4.7 \times 10^{19}$ $cm^{-3}$.

EXAMPLE 3

Figure 2:
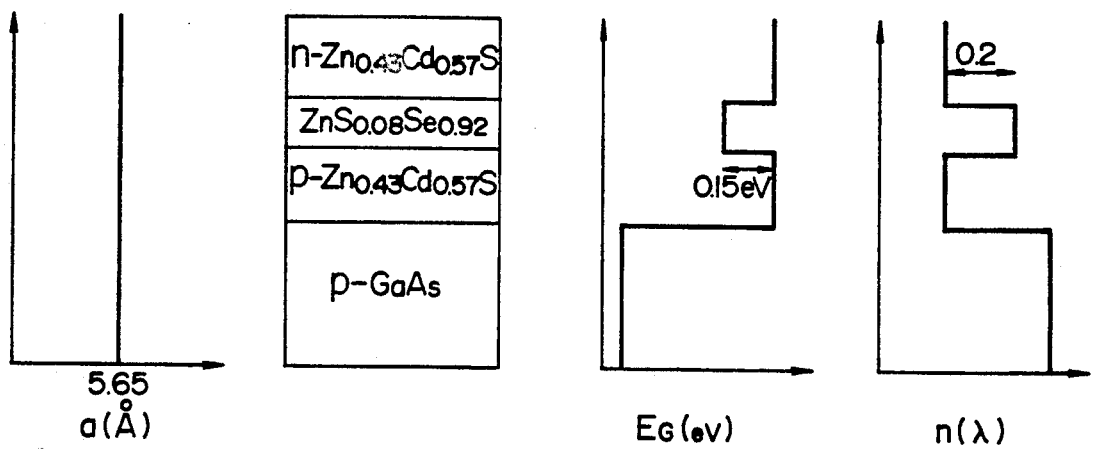
FIGS. 2 and 3 are drawings showing relationships between double-hetero structures of examples of the present invention, band gap energy ($E_G$), refractive index (n), and lattice constant (a).
Figure 4:
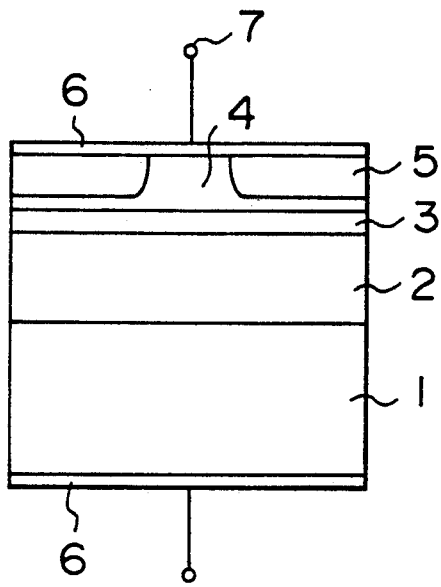
FIG. 4 is a cross-sectional view of one example of semiconductor laser having a double-hetero structure with a current narrowing structure.

Explanation is made referring to FIGS. 2 and 4. On a p-type GaAs (100) substrate 1 heated at 350° C., N-doped p-type $Zn_{0.43}Cd_{0.57}S$ 2 was grown in the same manner as described in Example 1 to a thickness of 3 μm. Then, $ZnS_{0.08}Se_{0.92}$ 3 was grown in thickness of 0.03 μm, followed by growth of Al-doped n-type $Zn_{0.57}Cd_{0.43}S$ 4 in thickness of 1 μm in the same manner as described in Example 2. Then, a current narrowing structure was formed by reactive ion etching (RIE) using $BF_3$ as an etchant, and insulated using highly resistant $SiO_2$ 5. Then, electrodes 6 were formed and connected to leads 7.

As is clear from FIG. 2, the resulting semiconductor device had a carrier and light confinement structure like a so-called double-hetero structure semiconductor laser.

When a direct-current forward bias of 4 V was applied to the resulting semiconductor device, there was obtained a blue laser light having a wavelength of 454 nm as a central wavelength and a half value width of 50 meV from a cleavage-plane of the layer 3 at room temperature. The threshold current density of laser oscillation (Jth) was 0.73 $KA/cm^2$.

Figure 3:
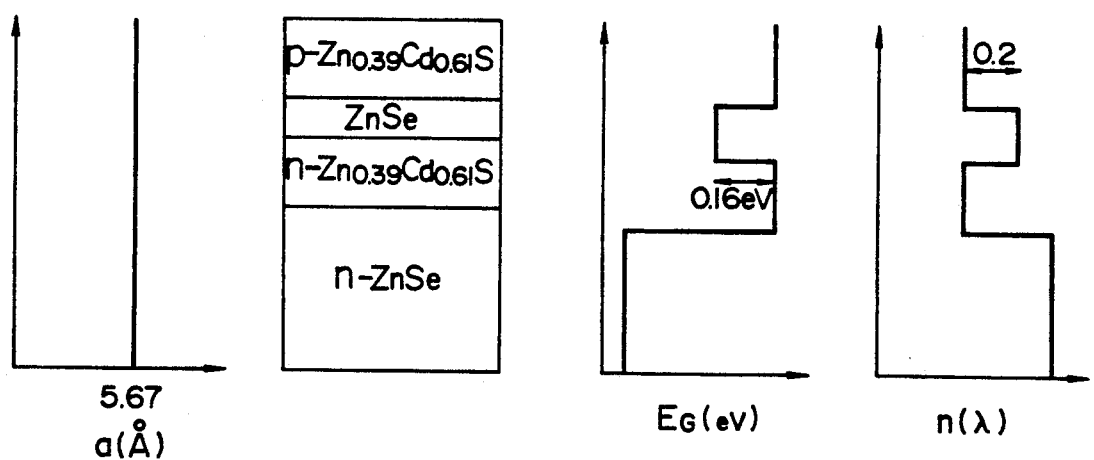

On the other hand, a double-hetero structure semiconductor light-emitting device having a current narrowing structure was formed in the same manner as described above using as the substrate 1 n-type ZnSe (100) and growing thereon n-type $Cd_{0.61}Zn_{0.39}S$ 2, ZnSe 3, and p-type $Cd_{0.61}Zn_{0.39}S$ 4 as shown in FIGS. 3 and 4.

When a direct-current forward bias of 4 V was applied to the resulting semiconductor device, there was obtained a blue laser light having a wavelength of 468 nm as a central wavelength from a cleavage-plane of the layer 3 at room temperature. The threshold current density of laser oscillation (Jth) was 0.52 $KA/cm^2$.

EXAMPLE 4

Figure 5:
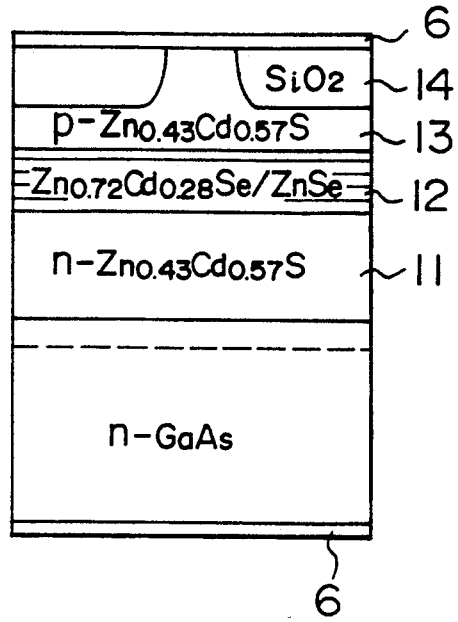
FIG. 5 is a cross-sectional view of a semiconductor laser obtained in Example 4.

A semiconductor device as shown in FIG. 5 was formed using n-GaAs (100) substrate in the same manner as described in Example 1. That is, after growing n-GaAs substrate in thickness of 0.3 μm, Cl-doped $Zn_{0.43}Cd_{0.57}S$ 11 as an n-type cladding layer of 3 μm thick was grown using zinc chloride ($ZnCl_2$) as an n-type dopant. Then, strained-layer superlattices of $Zn_{0.72}Cd_{0.28}Se$ (60 Å)/ZnSe (200 Å) 12 in 5 cycles were formed, followed by growth of N-doped $Zn_{0.43}Cd_{0.57}S$ 13 as a p-type cladding layer thereon in 2 μm thick. Then, an insulating structure for current narrowing 14 was formed by RIE and $SiO_2$ sputtering. Finally, electrodes 6 were formed and leads were connected thereto.

The carrier concentrations of n-type cladding layer and p-type cladding layer grown on highly resistant GaAs (100) substrate measured in the same manner as mentioned above were $2.4\times10^{18}$ cm$^{-3}$ and $1.2\times10^{18}$ cm$^{-3}$, respectively.

When a direct-current forward bias of 6 V was applied to the resulting semiconductor device, there was obtained a blue laser light having a wavelength of 488 nm as a central wavelength and a half value width of 39 mev from a cleavage-plane of the layer 12 at room temperature. The threshold current density of laser oscillation (Jth) was 0.55 KA/cm$^2$.

Figure 6:
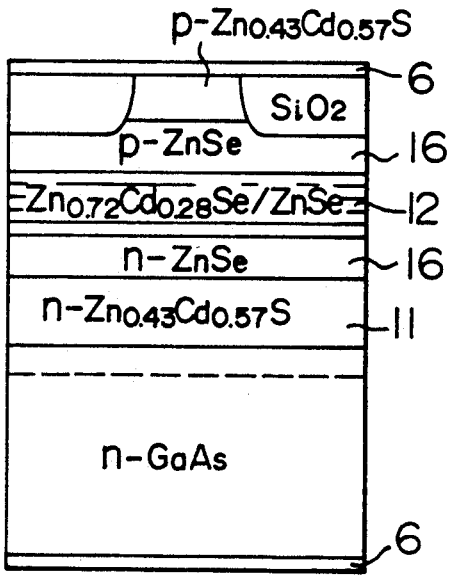
FIG. 6 is a cross-sectional view of a semiconductor laser obtained in Example 4.

On the other hand, a semiconductor device as shown in FIG. 6 having an n-type light guiding layer 16 having a composition of $ZnS_{0.08}Se_{0.92}$ and a carrier concentration of $3.2\times10^{18}$cm$^{-3}$ between the layer 11 and the layer 12, and a p-type light guiding layer 16 having a carrier concentration of $2.2\times10^{18}$cm$^{-3}$ between the layer 12 and the layer 13 was formed in the same manner as mentioned above.

When a direct-current forward bias of 4 V was applied to the resulting semiconductor device, there was obtained a blue laser light having a wavelength of 496 nm as a central wavelength from a cleavage-plane of the layer 12 at room temperature. The Jth was 0.43 KA/cm$^2$.

Further, the same effects could be obtained when n-type $ZnS_{0.08}Se_{0.92}$ (having an opposed conductivity) was used in place of $SiO_2$ (as a current narrowing layer) shown in FIG. 6.

EXAMPLE 5

Figure 7:
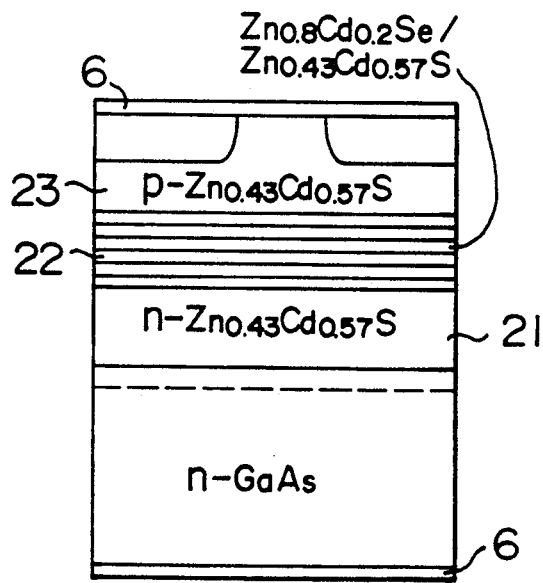
FIG. 7 is a cross-sectional view of a semiconductor laser obtained in Example 5.

A semiconductor device as shown in FIG. 7 was formed in the same manner as described in Example 4 except for forming as an active layer 22 6 cycles of $Zn_{0.8}Cd_{0.2}S_{0.2}Se_{0.9}$ (60 Å)/$Zn_{0.57}S$ (200 Å) between a first cladding layer 21 and a second cladding layer 23.

The resulting semiconductor device showed the laser oscillation at room temperature with the wavelength of 468 nm. The Jth was 0.77 KA/cm$^2$.

On the other hand, a semiconductor device having an n-type light guiding layer having a carrier concentration of $2.0\times10^{18}$ cm$^{-3}$ between the layer 21 and the layer 22, and a p-type light guiding layer having a carrier concentration of $2.2\times10^{18}$ cm$^{-3}$ between the layer 22 and the layer 23 was formed in the same manner as mentioned above.

When a direct-current forward bias of 4 V was applied to the resulting semiconductor device, there was obtained a blue laser light having a wavelength of 472 nm as a central wavelength from a cleavage-plane of the layer 22 at room temperature. The Jth was 0.43 KA/cm$^2$.

As mentioned above, according to the present invention, there is obtained a blue light-emitting semiconductor device such as a blue-light semiconductor laser. Thus, there can be provided the semiconductor laser usable as a light source for high density optical disks, blue LEDs, highly sensitive laser printer, displays, etc.

What is claimed is:

1. A thin film structure for a semiconductor device, comprising a layer of a semiconductor having a crystal composition of $Cd_xZn_{1-x}S$, where $0<x<1$, and p-type conductivity.

2. A thin film structure for a semiconductor device according to claim 1, wherein said layer is provided on a substrate, and said substrate is made of a material selected from the group consisting of ZnSe, ZnSSe, CdZnSe, CdZnSSe, GaAs, GaAlAs, GaAlInAs, GaAlAsP, GaAlInAsP, Si, Ge and SiGe.

3. A thin film structure for a semiconductor device, comprising a layer of a semiconductor having a crystal composition of $Cd_xZn_{1-x}S$, where $0<x<1$, a carrier concentration of $10^{17}$ cm$^{-3}$ or more and n-type conductivity.

4. A thin film structure for a semiconductor device according to claim 3, wherein said crystal composition is doped with an element of Group III or VII of the Periodic Table.

5. A thin film structure for a semiconductor device according to claim 4, wherein said element is selected from the group consisting of Cl, I, Br, Ga, Al and In.

6. A thin film structure for a semiconductor device according to claim 3, wherein said layer is provided on a substrate, and said substrate is made of a material selected from the group consisting of ZnSe, ZnSSe, CdZnSe, CdZnSSe, GaAs, GaAlAs, GaAlInAs, GaAlAsP, GaAlAsP, GaAlInAsP, Si, Ge and SiGe.

7. A semiconductor light-emitting device comprising a substrate, and said substrate having formed thereon a first semiconductor having a first conductivity, a second semiconductor having a second conductivity (opposed to the first conductivity), and a third semiconductor sandwiched by said first and second semiconductors, said first and second semiconductors being thin films containing a composition of $Cd_xZn_{1-x}S$, where $0<x<1$, and said third semiconductor being a thin film containing a composition of $ZnS_ySe_{1-6}$, wherein $0\leq y \leq 1$, with first and second electrodes respectively electrically connected to said first and second semiconductors.

8. A semiconductor light-emitting device according to claim 7, wherein the band gap energy of each of said first and second semiconductors is larger than that of said third semiconductor.

9. A semiconductor light-emitting device according to claim 7, wherein said substrate, and said first, second and third semiconductors are almost lattice matched.

10. A semiconductor light emitting device according to claim 7, wherein said third semiconductor has a thickness of 2 nm to 0.1 μm.

11. A semiconductor light emitting device according to claim 7, wherein a band gap difference between said third semiconductor, and said first and second semiconductors, is at least 0.1 eV.

12. A semiconductor light emitting device according to claim 7, wherein heterojunctions are provided between the first and third semiconductors and between the second and third semiconductors.

13. A semiconductor light emitting device according to claim 7, wherein said third semiconductor is a strained-layer superlattice.

14. A semiconductor light-emitting device comprising a substrate of GaAs or ZnSe, and said substrate having formed thereon a first semiconductor having a p- or n-type conductivity and a composition of $Cd_xZn_{1-x}S$, where $0<x<1$, a second semiconductor having n- or p-type conductivity and a composition of $Cd_xZn_{1-x}S$, where $0<x<1$, and a third semiconductor having a composition of $ZnS_ySe_{1-y}$, where $0\leq y\leq 1$, and sandwiched by said first and second semiconductors, said substrate of GaAs or ZnSe, and said first, second and third semiconductors being almost lattice matched, with first and second electrodes respectively electrically connected to said first and second semiconductors.

15. A semiconductor light emitting device according to claim 14, wherein said third semiconductor has a thickness of 2 nm to 0.2 μm.

16. A semiconductor light emitting device according to claim 14, wherein a band gap difference between said third semiconductor, and said first and second semiconductors, is at least 0.1 eV.

17. A semiconductor light emitting device according to claim 14, wherein heterojunctions are provided between the first and third semiconductors and between the second and third semiconductors.

18. A semiconductor light emitting device according to claim 14, wherein said third semiconductor is a strained-layer superlattice.

19. A semiconductor light-emitting device comprising a substrate, a layer of a first semiconductor having a first conductivity formed on said substrate, a layer of a third semiconductor formed on said first semiconductor layer, and a layer of a second semiconductor having a second conductivity opposed to the first conductivity formed on said third semiconductor layer, said first and second semiconductors having a composition of $$Cd_xZn_{1-x}S_ySe_{1-y}(0<x\leq 1, 0\leq y\leq 1)$$

and said third semiconductor having a composition of $$Cd_xZn_{1-x}S_ySe_{1-y}(0\leq x\leq 1, 0\leq y\leq 1),$$

a band gap energy smaller than those of said first and second semiconductors and a refractive index larger than those of said first and second semiconductors, with first and second electrodes respectively electrically connected to said first and second semiconductor layers.

20. A semiconductor light-emitting device comprising a substrate, a layer of a first semiconductor having a first conductivity and a composition of $$Cd_xZn_{1-x}S_ySe_{1-y}(0<x\leq 1, 0\leq y\leq 1)$$

formed on said substrate, a layer of a third semiconductor having a composition of $$Cd_xZn_{1-x}S_ySe_{1-y}(0\leq x\leq 1, 0\leq y\leq 1)$$

formed on said first semiconductor layer, and a layer of a second semiconductor having a second conductivity and a composition of $$Cd_xZn_{1-x}S_ySe_{1-y}(0\leq x\leq 1, 0\leq y\leq 1)$$

formed on said third semiconductor layer, and said first or second semiconductor having a p-type conductivity, with first and second electrodes respectively electrically connected to said first and second semiconductor layers.

21. A semiconductor light-emitting device according to claim 20, wherein said first or second semiconductor has a carrier concentration of $10^{17}$ cm$^{-3}$ or more at room temperature and a n-type conductivity.

22. A semiconductor light-emitting device according to claim 20, wherein all said semiconductors including said first, second and third semiconductors are almost lattice matched.

23. A semiconductor light-emitting device according to claim 20, wherein said substrate is a semiconductor having a composition of $$Cd_xZn_{1-x}S_ySe_{1-y}(0\leq x\leq 1, 0\leq y\leq 1),$$

$$Ga_xAl_yIn_{1-x-y}As_zP_{1-z}(0\leq x+y\leq 1, 0\leq z\leq 1), \text{ or}$$

$$Si_xGe_{1-x}(0\leq x\leq 1).$$

24. A semiconductor light-emitting device according to claim 20, wherein said third semiconductor has a band gap energy smaller than those of said first and second semiconductors.

25. A semiconductor light-emitting device according to claim 30, wherein at least one surface of said third semiconductor layer is covered with a light guiding layer.

26. A semiconductor light-emitting device according to claim 25, wherein said light guiding layer has a composition of $$Zn_xCd_{1-x}S_yTe_{1-y-z}(0\leq x, y, z\leq 1, 0\leq y+z\leq 1),$$

$$Ga_yAl_zIn_{1-y-z}As_xP_{1-x}(0\leq x, y, z\leq 1, 0\leq y+z\leq 1), \text{ or}$$

$$Si_xGe_{1-x}(0\leq x\leq 1).$$

27. A thin film structure for a semiconductor device, comprising a layer of a semiconductor having a crystal composition of $Cd_xZn_{1-x}S$, where $0<x\leq 1$, and p-type conductivity, wherein said layer of a semiconductor has a carrier concentration of $10^{17}$ cm$^{-3}$ or more.

28. A thin film structure for a semiconductor device according to claim 27, wherein said layer is provided on a substrate, and said substrate is made of a material selected from the group consisting of ZnSe, ZnSSe, CdZnSe, CdZnSSe, GaAs, GaAlAs, GaAlInAs, GaAlAsP, GaAlInAsP, Si, Ge and SiGe.

29. A thin film structure for a semiconductor device according to claim 28, wherein said crystal composition is doped with nitrogen.

* * * * *